United States Patent [19]

Nicollian et al.

[11] 4,278,947
[45] Jul. 14, 1981

[54] PRECISION FREQUENCY SOURCE USING INTEGRATED CIRCUIT ELEMENTS

[75] Inventors: Edward H. Nicollian, Murray Hill; Harold Seidel, Warren; George E. Smith, Murray Hill, all of N.J.

[73] Assignee: Bell Telephone Laboratories, Incorporated, Murray Hill, N.J.

[21] Appl. No.: 76,313

[22] Filed: Sep. 17, 1979

Related U.S. Application Data

[63] Continuation-in-part of Ser. No. 940,398, Sep. 8, 1978, abandoned.

[51] Int. Cl.³ .............................................. H03L 7/00
[52] U.S. Cl. ..................................... 331/1 R; 331/17; 331/177 V; 307/605
[58] Field of Search .......................... 331/1 R, 17, 177; 307/233 R, 295, 221 D; 357/24

[56] References Cited

U.S. PATENT DOCUMENTS

| | | | |
|---|---|---|---|
| 3,049,631 | 8/1962 | Taylor | 331/1 R |
| 3,210,678 | 10/1965 | Hallock | 331/17 |
| 3,704,431 | 11/1972 | Finger | 331/177 R |
| 3,735,276 | 5/1973 | Apolant | 331/177 R |
| 3,754,234 | 8/1973 | Laane et al. | 340/347 DA |
| 3,758,865 | 9/1973 | McKibben | 331/1 R |
| 3,852,681 | 12/1974 | Underhill | 331/1 R |
| 3,881,117 | 4/1975 | Tompsett | 307/221 |
| 3,980,968 | 9/1976 | Ma | 331/71 |
| 4,119,925 | 10/1978 | Bossalaers | 331/1 A |
| 4,139,784 | 2/1979 | Sauer | 307/221 D |

OTHER PUBLICATIONS

Blanchard, Alain, *Phase Locked Loops,* Wiley and Sons, N.Y. 1976, Chap. I, pp. 3-7.

Primary Examiner—David K. Moore
Attorney, Agent, or Firm—Joseph P. Kearns

[57] ABSTRACT

Disclosed is a feedback regulated oscillator which comprises a reference signal source, a variable local oscillator, a converter responsive to the variable local oscillator for developing a signal, compatible with the signal of the reference source, having a magnitude which is responsive to the frequency of the local oscillator, and a comparator, responsive to the reference signal source and to the converter, for controlling the frequency of the variable local oscillator.

1 Claim, 8 Drawing Figures

PERIOD ($t_0$-$t_1$)

PERIOD ($t_1$-$t_2$)

PERIOD ($t_2$-$t_3$)

PERIOD ($t_3$-$t_0$)

PRECISION FREQUENCY SOURCE USING INTEGRATED CIRCUIT ELEMENTS

CROSS-REFERENCE TO RELATED APPLICATION

The application is a continuation-in-part of our copending application, Ser. No. 940,398, filed Sept. 8, 1978 and now abandoned.

BACKGROUND OF THE INVENTION

1. Field of the Invention

This relates to signal oscillators and, more particularly, to signal oscillators employing feedback regulation of frequency.

2. Description of the Prior Art

High accuracy conventional oscillators are characterized by their use of quartz crystals as the frequency determining elements. The use of crystals, however, precludes these oscillators from being fully integrable, i.e., capable of being realized in integrated circuit form. On the other hand, oscillators that are integrable generally employ resistors and capacitors as their frequency determining elements, but the time constants developed by these and other components in the circuit are temperature dependent thereby affecting the operating frequency and its precision with changing temperature.

In the art of feedback regulation of frequency, a technique employing both crystal and noncrystal (variable) oscillators is often used. The crystal oscillator is employed as a "standard" and a multiple of the variable oscillator is compared to the "standard" in a phase comparator. In turn, the error signal developed by the phase comparator is utilized to control the frequency of the variable oscillator. From the integrability standpoint, this arrangement, which generally is called a phase-lock loop, suffers from the same drawbacks that crystal oscillators do; to wit, the crystal oscillator cannot be fully integrated.

SUMMARY OF THE INVENTION

It is an object of this invention to realize a simple high stability oscillator.

It is another object of this invention to realize a frequency-stable oscillator that is fully integrable.

These and other objects and advantages are achieved in an oscillator circuit which employs a reference signal source, a controlled variable-frequency local oscillator, a converter responsive to the local oscillator for developing a signal compatible with the signal of the reference source and having a magnitude which is proportional to the frequency of the local oscillator, and a comparator circuit responsive to the reference source and to the converter for controlling the local oscillator to develop the desired frequency.

BRIEF DESCRIPTION OF THE DRAWING

The above and other objects of this invention will be realized from a consideration of the detailed description, presented by way of example, with reference to the accompanying drawings in which.

DETAILED DESCRIPTION

Figure 1:
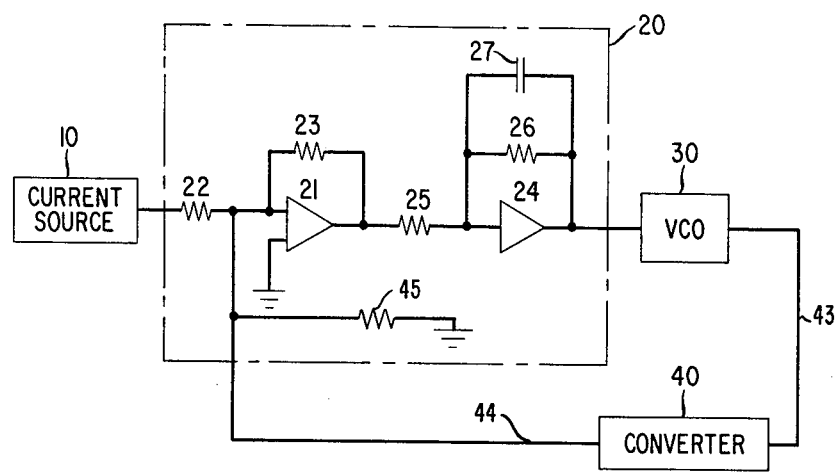
FIG. 1 is a block schematic diagram of a precision oscillator in accordance with this invention.

FIG. 1 depicts the schematic diagram of an oscillator structured in accordance with the principles of this invention. It includes current source 10 connected to a first input of current comparator circuit 20, a conventional voltage controlled oscillator (VCO) 30 responsive to circuit 20, and frequency-to-current converter 40 driven by VCO 30 and having its output current applied to a second input of circuit 20.

In operation, the frequency dependent output current of frequency-to-current converter 40 is compared in element 20 to the reference current of element 10. When the frequency dependent current of circuit 40 differs from the reference current of source 10, an error voltage is produced in element 20 which adjusts the frequency of VCO 30 in the direction which brings the current of circuit 40 closer, in magnitude, to the reference current of element 10, thereby reducing the error voltage and developing a frequency of oscillation in VCO 30 that is strictly a function of the reference current.

From the above, it can be appreciated that only converter 40 and current source 10 must be stable with respect to temperature and supply voltage variations, and that changes in all other circuit parameters have no effect on the frequency developed by VCO 30.

CONVERTER 40

Converter 40 generates a current that is both voltage and temperature insensitive, and has a DC component that is directly proportional to the frequency of the signal applied to converter 40. This is realized through the novel use of a metered charge CCD (charge-coupled device) which produces charge packets of a magnitude that is determined soley (ignoring a small leakage of charge) by the depth of a potential well in the CCD. The depth of the potential well is fixed by the density of implanted, ionized, dopant impurities.

The CCD is a semiconductor device best known for its use as a shift register. Localized accumulations of electrical charge are controllably translated through regions of a semiconductor medium by means of applied clock voltages. A typical metered-charge CCD controlled by a repetitive clock source to perform the shift-register function is described by M. F. Tompsett in U.S. Pat. No. 3,881,117 issued Apr. 29, 1975.

Figure 2:
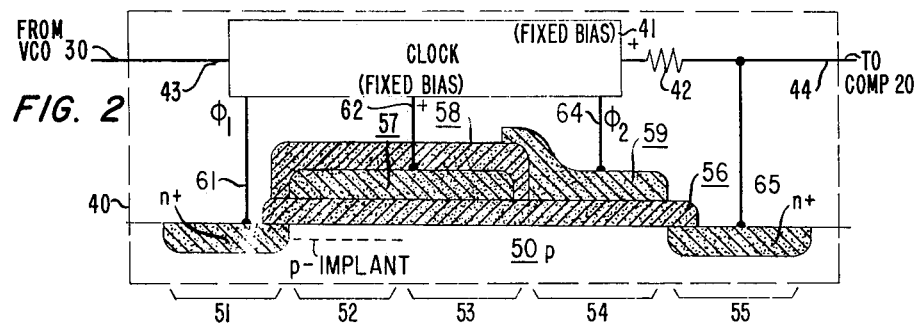
FIG. 2 is a cross-section of a metered charge-coupled device together with its electrical connections into the block diagram of FIG. 1.

FIG. 2 shows a cross-section of a metered charge CCD 50 together with clock source 41 useful in implementing converter 40 of FIG. 1. It is composed of a p-type substrate 50 having two separated n+ regions embedded therein and forming region 51 on the left and region 55 on the right. To the right of region 51 there is a p-type implant extending to about one-third the distance between regions 51 and 55 and creating thereby region 52. Insulating layer 56, made up for example of silicon oxide, is depsited or thermally grown upon substrate 50 between regions 51 and 55, and a silicon layer 57 is deposited or thermally grown above layer 56, between regions 51 and 55 and extending from the end of region 51 to approximately two-thirds the distance toward region 55. A second insulating layer 58 is deposited or thermally grown over layer 57, and a silicon or metal layer 59 is deposited or thermally grown to cover the region between the end of layer 57 and the beginning of region 55.

Figure 8:
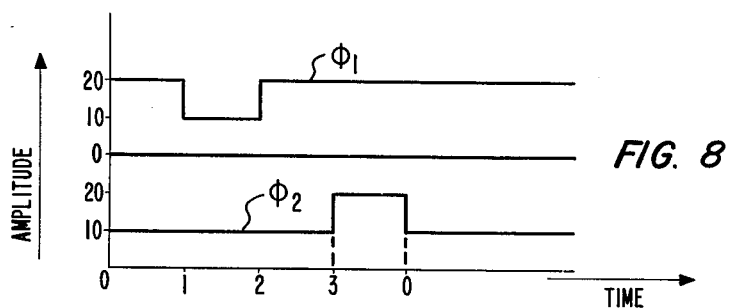
FIG. 8 is a waveform diagram of two concurrent phases of the output of a clock useful in the practice of this invention.

The structure of the FIG. 2 CCD thus defines five regions; regions 51 and 55, region 52 which corresponds to the area of the p-type implant, region 53 which covers the area of silicon layer 57 but excludes region 52, and region 54 which corresponds to the region covered by silicon or metal layer 59. Clock source 41 responds over lead 43 to the output of VCO 30 in FIG. 1 and supplies cyclical potentials $\phi_1$ and $\phi_2$, as shown in FIG. 8, in addition to fixed biases. The potential levels of the regions 51 and 54 are controlled by the cyclical potentials of leads 61 and 64 which are connected to the n+ material of region 51 and layer 59, respectively. The potential levels of regions 52 and 53 are commonly related to the fixed voltage potential of lead 62 (connected to silicon layer 57,), but relative to each other, the potential levels of regions 52 and 53 differ due to the p-type implant in region 52. The relative potential difference between regions 52 and 53 is insensitive to temperature since the two regions are always at the same temperature. This relative potential difference, which is also insensitive to the voltage of lead 62, is employed to develop metered charge packets, as shown in the potential diagrams of FIGS. 3 through 6 and described below. The output of CCD 50 appears at lead 65 connected to region 55 and at lead 44 running to comparator 20 in FIG. 1. The junction of leads 65 and 44 is connected to clock 41 through resistor 42.

FIGS. 3 through 6 are keyed to the regions 51 through 55 indicated in FIG. 2.

FIG. 8 shows a clock waveform diagram of the output of clock 41 in FIG. 2 with upper waveform $\phi_1$ controlling the potential of region 51 in FIG. 2 and lower waveform $\phi_2$, the potential of region 54. The abscissa represents time by four-phase cycle (similar to FIG. 2.1 of Tompsett) and the ordinate, approximate voltage levels. Each four-phase cycle repeats at a rate determined by the output of VCO 30 in FIG. 1.

Figure 3:
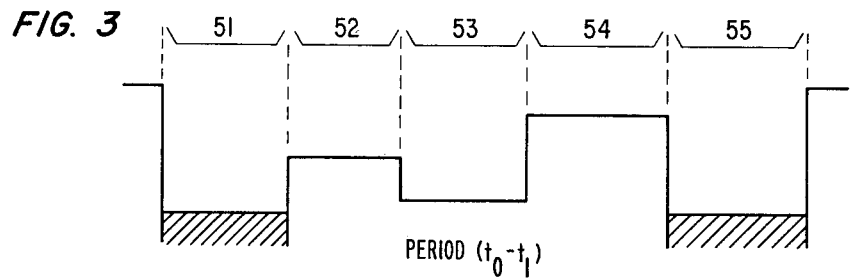
FIGS. 3 through 6 are state diagrams of the charge-coupled device of FIG. 2 during four repetitive clock cycles.

FIG. 3 depicts a first state of the metered charge device of FIG. 2 during the periods from time 0 to time 1 (shown in FIG. 8) when the voltages of leads 61, 62, 64 and 65 are such that the potentials of regions 51 and 55 are lower than the potentials of regions 52 and 54, respectively; and the potential of region 54 is higher than the voltage of region 52.

Figure 4:
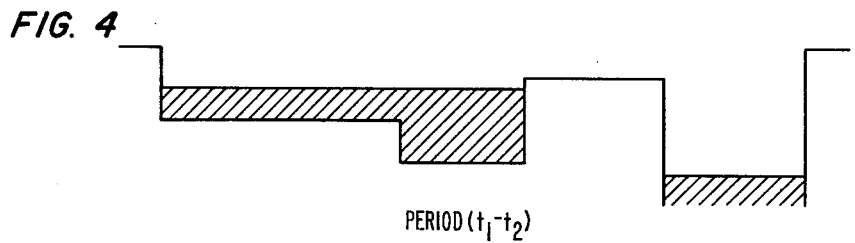

FIG. 4 depicts a second state of the metered charge device during the periods from time 1 to time 2 with the potential of region 51 increased beyond the potential of region 52 (by modifying the voltage of lead 61 relative to lead 62 by clock output $\phi_2$). Due to the increased potential of region 51, a charge flows from region 51 into regions 52 and 53.

Figure 5:
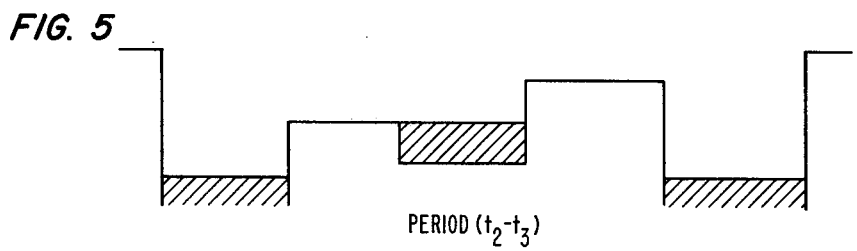

FIG. 5 depicts a third state of the metered charge device during the periods from time 2 to time 3, when the potential in region 51 is decreased to its former quiescent level; trapping thereby a quantum or packet of charge in region 53.

Figure 6:
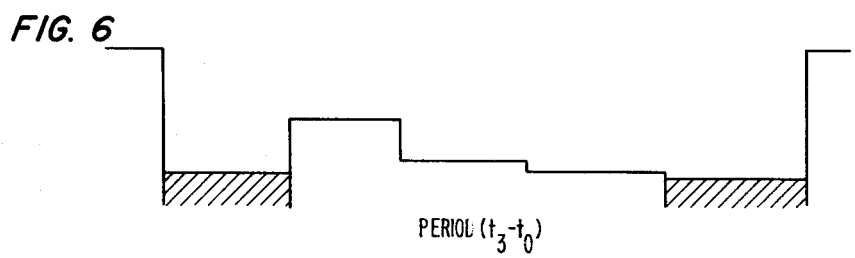

FIG. 6 depicts a fourth state of the metered charge device during the periods from time 2 to time 0 when the potential of region 54 is decreased below the potential of region 53 (but not below the potential of region 55), thereby transferring the charge in region 53 to region 55. The latter charge is extracted through lead 65 and delivered to comparator 20 over lead 44 in FIG. 1.

From the above it can be realized that the CCD in converter 40 delivers a metered charge packet at every sequence of four clock intervals. During the first, third and fourth clock intervals, the potential of region 51 is quiescent at a level below that of regions 52 through 54 and the same as that of region 55. During the first, second and third clock intervals, the potential of region 54 is quiescent at a level above that of the remaining regions. During the second clock interval phase $\phi_1$ the potential of region 51 rises at least to the level of adjacent region 52. During the fourth clock interval the potential of region 54 drops below the leval of adjacent region 53, but slightly above that of region 55. Regions 52, 53 and 55 remain fixed at the relative levels shown in FIGS. 3 through 6. The four clock pulse sequence is realized in converter 40 in a conventional manner; e.g., by dividing the frequency of the output of VCO 30 in a counter by four.

The average current flowing out of the CCD toward ground through resistor 45 shown in comparator circuit 20 in FIG. 1 is proportional to the quantum of charge produced at every occurrence of the four clock pulse sequence and to the repetition rate of that clock sequence; i.e., $$I = Qf$$

where I is the current, in amperes; Q is the developed charge, in coulombs; and f is the frequency of the clock sequence (after the division by 4), in hertz.

The above-defined current does not take into account a small leakage current that is thermally generated and appears as an addition to the output of the device. That current is essentially constant and independent of the frequency of operation. Increasing the frequency f increases the current I and decreases the effect of the leakage current. For a stability of 0.01% at temperature not over 60° C. in the oscillator, a frequency of 1 MHz is sufficiently high to permit a total disregard for the leakage current.

CURRENT SOURCE 10

Figure 7:
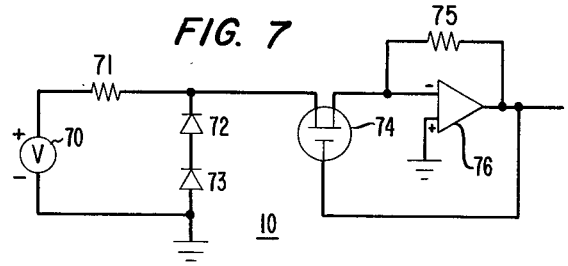
FIG. 7 is a block schematic diagram of a realization of a current source useful in the practice of this invention.

FIG. 7 illustrates one manner by which reference current source 10 can be realized. In FIG. 7, the series connection of resistor 71 and back-biased diodes 72 and 73 across positive voltage source V places diodes 72 and 73 in a breakdown condition and thus develops a relatively constant voltage across the two diodes. As explained in *Physics of Semiconductor Devices* by S. M. Sze (John Wiley and Sons, 1979) in Chapter 3 at page 133, diode 72 is advantageously in avalanche diode with a positive temperature coefficient and diode 73, a tunnel diode with a negative temperature coefficient. Both of these diodes are formed by integrated circuit techniques.

The constant voltage developed across diodes 72 and 73 is applied to the drain of n-channel enhancement mode MOS field effect transistor 74, causing MOSFET 74 to operate in saturation and produce a constant current at its source. The source of MOSFET 74 is connected to the negative input of operational amplifier 76 and to one lead of resistor 75 of value R. The other lead of resistor 75 is connected to the output of amplifier 76 and to the gate of MOSFET 74. The positive input of amplifier 76 is connected to the negative potential of voltage source V.

The output voltage of amplifier 76 may be computed by observing that the drain current $I_D$ of MOSFET 74 may be closely approximated by $\beta(V_{GS}-V_p)^2$ where $V_{GS}$ is the gate to source potential, $V_p$ is the source potential, and $\beta$ is a proportionality constant related to the geometry of the MOS structure and the channel carrier mobility. Both $\beta$ and $V_p$ are temperature dependent. Since $V_{GS}$ of MOSFET 74 in FIG. 7 is equal to $I_D R$, the current through MOSFET 74 is expressable by the quadratic equation $$R^2 I_D^2 - (2I_D/R)(V_p + 1/\beta R) + V_p^2 = 0$$

which, when $V_p > 1/\beta R$, yields a current $$I_D = V_p/R$$

through MOSFET 74 and a voltage $V_p$ at the output of amplifier 76. The inequality relating $V_p$ and $\beta R$ is readily achieved in practice.

The voltage $V_p$ decreases in a nearly linear fashion with increasing temperature over a limited temperature range and, correspondingly, the output voltage of amplifier 76 also decreases linearly with increasing temperature. This temperature variation may be compensated by choosing a complementing temperature coefficient for the resistor across which the output voltage of amplifier 76 is impressed.

The resistance of feedback resistor 75 in FIG. 7 must decrease approximately linearly with increasing temperature over the temperature range of normal operation. The degree to which drain current $I_D$ and hence the output current of current source 10 in FIG. 1 is independent of temperature depends on how closely the temperature coefficients of $V_p$ and $R_{75}$ match and how linearly these values change with temperature. A thin-film resistor deposited over the oxide of the integrated circuit is suitable as a realization of $R_{75}$. The temperature coefficient of $R_{75}$ can be tailored by the thickness of the film, while the frequency of the oscillator can be tailored by the surface area of the thin film. $V_p$ can be made to vary approximately linearly with temperature by lightly doping the substrate of MOSFET 74, and drain current $I_D$ can be made independent of drain bias by making the channel of MOSFET 74 on the order 15 microns in length.

COMPARATOR 20

As depicted in FIG. 1, comparator 20 is composed of a comparator section and a filter section. In the comparator section, the negative input of operational amplifier 21 is connected to converter 40 by lead 44, to current source 10 through resistor 22 and to the output of operational amplifier 21 through resistor 23. The positive input of amplifier 21 is grounded. In the filter section, the output voltage of amplifier 21 is connected to the input of inverting amplifier 24 through resistor 25, and a parallel connection of resistor 26 and capacitor 27 is connected across the input and output terminals of amplifier 24.

In operation, the reference current $V_p/R_{75}$ which is developed by current source 10 in conjunction with resistor 75 is added to the current I of converter 40, and the sum current flows through resistor 23 in the feedback loop of amplifier 21, developing thereby a voltage $(I + V_p/R_{75})R_{23}$ at the output of amplifier 21. As indicated previously, the temperature coefficient of $R_{75}$ may be adjusted to offset the temperature coefficient of $V_p$, yielding a stable reference current $I_{ref}$. The output voltage at the output of amplifier 21 is the error voltage which effectively is applied to VCO 30 to cause VCO 30 to alter the current I out of converter 40 and reduce the error voltage.

The reference current developed by source 10 is a direct current. On the other hand, the output current of converter 40, I, is a pulsed current having a nonzero average value (DC component). To make comparator 20 responsive only to the direct component in I, the output voltage of amplifier 21 is applied to the low-pass filter section of amplifier 24. The gain and the low frequency cutoff of the filter section are dictated, conventionally, by the values of resistors 25 and 26 and capacitor 27. The filtered output voltage of amplifier 24 is applied to voltage controlled oscillator 30 to develop the desired frequency.

Although FIG. 1 depicts the low-pass filter following the comparator section, persons who are skilled in the art may realize that the filter may be applied directly to the output of converter 40 or that in some applications (e.g., where average frequency rather than instantaneous frequency is important) the filter may be omitted entirely. Also, voltage controlled oscillator 30 may be replaced by an oscillator that is current controlled. Alternatively, reference source 10 may be made to develop a DC reference voltage rather than current, converter 40 may be a frequency-to-voltage converter, and comparator 20 may be a voltage comparator.

In an alternative embodiment of current source 10 shown in FIG. 7, MOSFET 74 can be a p-channel depletion mode type. In this case the source and drain must be reversed.

We claim:

1. An oscillator circuit (FIG. 1) including a controlled local oscillator (30), a converter (40) for developing a signal proportional to the frequency of said controlled local oscillator (30), a reference signal source (10), and a comparator (20) jointly responsive to said converter (40) and to said source (10) for driving said controlled local oscillator (30), characterized in that
    said converter (40) is a metered charge-coupled device (FIG. 2)
comprising:
    an underlying p-type substrate (50) having first and secnd independent n-positive regions (51,55) embedded therein and a p-type implant (52) located between said first and second regions and lying directly adjacent to said first region (51) only,
    a first insulating layer (56) deposited atop said p-type substrate (50) including said embedded first (51) and second (55) regions and said p-type implant (52),
    a silicon layer (57) deposited atop said first insulating layer (56) and extending from the inner edge of said first region (51) and above said p-type implant (52) extending toward but not reaching said second region (55),
    a second insulating layer (58) surrounding said silicon layer (57), and
    a metallized layer (59) extending from above said silicon layer (57) to the inner edge of said second region (52),
    conductive electrodes (61, 62, 64, 65) being connected to each of said first (51) and second (55) regions and to each of said silicon (57) and metallized (59) layers whereby under the control of selected sequences of potentials applied to the several electrodes measured packets of electrical charges can be transferred between said first (51) and second (52) regions at a rate proportional to the frequency of the output of said local oscillator.

* * * * *